United States Patent
Voutilainen et al.

(10) Patent No.: US 8,412,109 B2
(45) Date of Patent: Apr. 2, 2013

(54) METHOD FOR CHARACTERIZING THE RADIO LINK OF RFID TAGS

(75) Inventors: Jukka Voutilainen, Helsinki (FI); Juho Partanen, Helsinki (FI); Jesse Tuominen, Kirkkonummi (FI)

(73) Assignee: Voyantic Oy, Espoo (FI)

( * ) Notice: Subject to any disclaimer, the term of this patent is extended or adjusted under 35 U.S.C. 154(b) by 824 days.

(21) Appl. No.: 12/442,077

(22) PCT Filed: Feb. 18, 2008

(86) PCT No.: PCT/FI2008/050069
§ 371 (c)(1),
(2), (4) Date: May 8, 2009

(87) PCT Pub. No.: WO2008/099067
PCT Pub. Date: Aug. 21, 2008

(65) Prior Publication Data
US 2010/0039230 A1    Feb. 18, 2010

(30) Foreign Application Priority Data
Feb. 16, 2007  (FI) ..................................... 20075108

(51) Int. Cl.
*H04B 17/00* (2006.01)

(52) U.S. Cl. ............... 455/67.11; 455/67.12; 455/67.13; 455/67.14; 455/67.15; 455/67.16; 455/63.4; 455/115.1; 455/115.2; 455/115.3; 455/115.4; 455/226.2

(58) Field of Classification Search ................ 455/67.11
See application file for complete search history.

(56) References Cited

U.S. PATENT DOCUMENTS 6,104,291 A    8/2000  Beauvillier et al.
6,236,223 B1   5/2001  Brady et al.
(Continued)

FOREIGN PATENT DOCUMENTS

JP    2003-204286 A   7/2003
JP    2005-260468 A   9/2005
(Continued)

OTHER PUBLICATIONS

Puleston, D.J., et al. "The test pyramid: A framework for consistent evaluation of RFID tags from design and manufacture to end use". White Paper, Avery Dennison RFID Division Manual, Oct. 3, 2005, pp. 1-7.

(Continued)

*Primary Examiner* — Fayyaz Alam
*Assistant Examiner* — Mohammed Rachedine
(74) *Attorney, Agent, or Firm* — Birch, Stewart, Kolasch & Birch, LLP

(57) ABSTRACT

The method relates to a method of characterizing a radio link. In the method, a radio frequency interrogator and a first radio frequency transponder, the response of which in an essentially anechoic chamber is known, are utilized. According to the invention, the response of the first radio frequency transponder is measured in a target environment in the chosen interrogator-transponder geometry and the responses of the radio frequency transponder in the target environment and in an essentially anechoic chamber are compared for characterizing the actual radio link. The invention provides information on multi-path propagation of radio waves characteristic to the target environment, which can be further taken into account in, for example, RFID system design.

28 Claims, 5 Drawing Sheets

U.S. PATENT DOCUMENTS

| | | | |
|---|---|---|---|
| 7,228,105 B2 * | 6/2007 | Rowell et al. | 455/67.11 |
| 7,400,989 B2 | 7/2008 | Chapman et al. | |
| 7,444,264 B2 * | 10/2008 | Kildal | 702/182 |
| 7,471,233 B2 * | 12/2008 | Kurihara et al. | 342/4 |
| 7,526,266 B2 | 4/2009 | Al-Mahdawi | |
| 2003/0193902 A1 | 10/2003 | Ryckebusch et al. | |
| 2004/0137844 A1 | 7/2004 | Desjeux et al. | |
| 2005/0059355 A1 * | 3/2005 | Liu | 455/67.14 |
| 2006/0194553 A1 * | 8/2006 | Ozaki et al. | 455/226.1 |
| 2006/0232413 A1 | 10/2006 | Lam et al. | |
| 2006/0238302 A1 | 10/2006 | Loving et al. | |
| 2007/0103313 A1 * | 5/2007 | Washington | 340/572.8 |
| 2007/0206701 A1 * | 9/2007 | Paley et al. | 375/295 |
| 2008/0012710 A1 * | 1/2008 | Sadr | 340/572.1 |

FOREIGN PATENT DOCUMENTS

| | | |
|---|---|---|
| WO | WO-00/28339 A1 | 5/2000 |
| WO | WO-2005/086279 A1 | 9/2005 |
| WO | WO-2007/005134 A2 | 1/2007 |

OTHER PUBLICATIONS

Nikitin, P. V. and K.V.S. Rao, "Theory and Management of Backscrattering from RFID Tags", IEEE Antennas and Propagation Magazine, vol. 48 (2006), No. 6, pp. 1-8.

* cited by examiner

METHOD FOR CHARACTERIZING THE RADIO LINK OF RFID TAGS

The present invention relates to a method for characterizing a radio link in radio frequency systems, especially in RFID systems (Radio Frequency IDentification).

BACKGROUND OF THE INVENTION

The use of passive ultra-high frequency (UHF) radio frequency identification (RFID) is increasing rapidly, especially in logistic applications. This is partly due to a globally accepted standard, EPC Class 1 Gen 2 (ISO 18000-6c), and numerous successful pilot cases all around the world. It seems that RFID is finally starting to redeem the promises built during the last decades.

In passive UHF RFID, an interrogator (also: tag reader) transmits a radiating electromagnetic field to power up a transponder (also: tag). The interrogator modulates the carrier to send commands to the transponder. The transponder, in turn, responds to the command by changing its reflectivity to form modulation that can be detected with the receiver of the interrogator. Since the transponders are powered by the radiating electromagnetic field, the read range in passive UHF RFID is typically limited by power delivery to the transponder.

The huge promises of RFID have lured many companies and other parties to develop components for the developing industry. There are several integrated circuit (IC) manufacturers, dozens of inlay manufacturers, and hundreds of converters involved in the RFID industry. This diversity has led to a need to create metrics and measurement methods for verifying that the components conform to the applicable standards, and for comparing components with one another. Both the International Organization for Standardization (ISO) and EPCglobal have been active in this field.

In measurements of UHF frequency RFID tags the reflections caused by the surrounding environment typically cause error due to multi-path, i.e., echoed, propagation of RF waves. Due to these radio echoes the signal is transmitted from the transmitter to the tag and then from the tag to the receiver along a number of routes in addition to the direct route, and the signals interfere with each other at, for example, the locations of the tag and the receiver. When certain quantities, such as activation sensitivity, are measured in a frequency domain, waviness is formed in the frequency graph as interference changes with the frequency. As the mutual location of the tag and the reader changes in the environment, respective frequency graphs can be significantly different. Such a measurement result is more descriptive of the measurement environment than the actual frequency dependency of the sensitivity of the tag.

The most widely used tag performance measurements are based on measuring two things: how much radiated power is needed to activate the tag, and how strong is the response of the tag. These two concepts are typically measured as a function of some other parameters such as carrier frequency, orientation, interference, or the properties of the surrounding materials. The measurements may be performed with various different measurement systems. However, there are some common problems resulting from the nature of measuring in the radiating far field. Firstly, it is relatively easy to calibrate the measurement system up to the ports of a measurement device or the end of a cable. However, it is far more difficult to evaluate the magnitude of the radiating power at the location of the tag. Secondly, in order to perform measurements in the radiating far field without the effects of multi-path propagation, an anechoic chamber is typically needed. Such a chamber is, however, a large investment.

In acoustics, it is common to eliminate echoes of the measurement chamber by using the beginning of the measurement result only until the first echo is detected, whereby the responses caused by echoes are not taken into consideration. Due to the high propagation velocity of radio waves and the slow modulation of the carrier this is not usable for measuring RFID tags in an active state.

One possible method for determining operational adjustments of the reader, the type and tuning frequency of the tag as well as the measurement geometry in a target environment is to perform a number of measurements in the target environment and thus search for a usable configuration by bracketing. Such a trial and error method is, however, slow, and it does not guarantee finding even a nearly optimal reliability of operation.

An example of the measurement of tag properties performed in an anechoic chamber is disclosed in WO 2005/086279. The measurement is performed with two antennae (transmission/reception) and it is based on the way the tag located in the field of these two antennae changes the electromagnetic waves arriving to the receiver from the transmitter. The method can only be used in anechoic environments.

US 2004/0137844 discloses a method for adjusting a radio frequency receiver or a receiver and a transmitter on the basis of external interference level. The interference measurements do not, however, contain information about multi-path propagation and they can not be used for considering the interactions caused by the surrounding environment and the actual measurement process.

A white paper called "The test pyramid: a framework for consistent evaluation of RFID tags from design and manufacture to end use" published by Avery Dennison RFID Division (http://www.rfid.averydennison.com/_media/press/9.pdf) discloses a testing framework for RFID tags. The framework is based on a "test cube" allowing measurements of a tag at a defined distance from an antenna of an RFID reader. This setup allows for accurate measurements of tag properties, provided that the test cube itself is kept well calibrated and that the radio reflections from the surrounding environment do not significantly affect the measurement.

SUMMARY OF THE INVENTION

The aim of the invention is to eliminate at least some of the above-mentioned problems and to produce a novel method for effectively correcting the error caused by the surrounding environment especially for the purposes of RFID system design. A particular aim is to produce a method by means of which more information can be produced about the performance of the radio frequency system for finding the optimal system parameters, such as operation frequency, in the environment. A further aim of the invention is to provide a method for characterizing a radio link using only common, and thus well-defined and repeatable, tag performance measurements, such as tag sensitivity and backscatter signal strength as a function of frequency.

An aim is also to provide a novel method for calibrating a measurement system in a way that allows taking environmental factors into account.

The aims of the invention are achieved by the method according to claims 1 and 23. Further advantageous embodiments of the invention are characterized in the dependent claims.

The method is generally based on using a reference transponder (first transponder), such as an RFID tag, and a wireless interrogator capable of being coupled to the transponder through a radio-frequency electromagnetic excitation field. The actual (i.e. ideal) response of the reference transponder is known (i.e. it is measured or has been measured in an essentially anechoic chamber or a simulation model has been made about it, the model taking closely into account the operation of the transponder in a radiation field). According to the method, the response of the reference transponder is measured in a target environment in a predefined interrogator-transponder geometry and the responses of the reference transponder in the target environment and in an essentially anechoic chamber are compared for characterizing the radio link established at the target environment.

According to one embodiment, the thus achieved characterization of the radio link is used for compensating the effect of radio reflections from at least one other measurement carried out in the target environment.

According to one embodiment, the method is applied for measuring a second transponder (also: the transponder of interest) so that the response of the second radio frequency transponder is also measured in the target environment in the abovementioned interrogator-transponder geometry, subsequent to which the effect caused by the target environment is eliminated from the measured response of the second transponder on the basis of the responses determined for the reference transponder in the anechoic environment and in the target environment.

According to a preferred embodiment, the transponder is an RFID tag or the like device. However, as explained later, the method is suitable for characterizing radio links established between other types of wireless devices too, in particular those adapted for two-way digital communication.

Considerable advantages are achieved by means of the invention. Comparison of the responses of the reference tag in an anechoic environment and in the target environment is indicative of the reflections of the environment and its suitability for the communications system, such as an RFID system. It further creates a novel method for compensating measurement results of RFID tags in non-ideal conditions by reducing them to correspond with those measured in an anechoic environment. It is sufficient that one reference tag has once been measured in an anechoic chamber.

The method allows for taking into account multi-path propagation in all kinds of environments and measurement geometries. Thus, it is not restricted to laboratory conditions or spacious rooms or to short measurement distances (using which the radio reflections from the walls of the room are typically insignificant). In fact, according to a typical practical embodiment, the distance between the antenna of the interrogator and the transponder is not significantly smaller than the distance between the transponder and reflecting objects. Thus, there may be radio-wave reflecting objects at a distance from the transponder which is smaller than the distance between the reading antenna and the transponder.

The advantages of the invention are emphasized in RFID systems, as the operation environments are very diverse. RFID reading is often performed from a tag moving in relation to the environment and the tags can be located on a number of platforms having different sizes and made of different materials. All the above-mentioned factors affect the measurement due to multi-path propagation. In addition, there are a number of different tags (including the different variations of active and passive tags) with different properties with respect to sensitivity and directivity, among others.

Applying the principles shortly described above, the invention provides also a method for calibrating a radio-frequency communications system in a target environment, the method comprising
placing a first wireless transponder to a first location within the target environment,
measuring the response of the first wireless transponder using an interrogator placed to a second location within the target environment, and
comparing the measured response of the first wireless transponder with a response of the transponder in an essentially anechoic space for obtaining a calibration function characterizing said target environment.

In prior techniques for determining tag performance in an environment, the calibration of the measurement system is limited to the relatively well-determinable characteristics of the transmit and receive ports of the reader. In contrast to this, the present invention allows for taking into account the environmental factors, which, in addition to the characteristics of the reader and its transmit antenna, affect the field power at the location of the tag. That is, the measurement system can be calibrated "one step forward" within the target environment, thus taking environment-dependent power transmission factors to be taken into account at the tag location in all further measurements and analyses. The term "calibration to transponder/tag (location)" is used to describe this advantageous novel functionality of the invention.

DEFINITIONS OF TERMINOLOGY

By a "transponder" we mean a device comprising a wireless receiver operating in a radio frequency field having a certain activation point, most preferably a wireless transmitter-receiver, at least the receiver portion of which is adapted for wireless radio frequency communication. According to a typical embodiment, both the receiving and transmitting (response) portions of the transponder are adapted for wireless radio frequency communication, as is the case for example with RFID tags. However, it must be noted, that according to the invention in a general level, the response of the transponder may be measured using also wired electrical or optical channels, for example. An "activation point" means a certain power of a command signal received from the interrogator below which the command (e.g. reading/writing the RFID tag by an RFID reader) is not executed. A successful execution of the command can be deduced, for example, from the response of the tag or a change in its operational state. The invention is, however, usable for optimizing the operation of other than RFID systems, such as WLAN networks and the like digital data communication systems.

An "interrogator" or "reader", as herein used, is a device capable of coupling to the transponder used through an electromagnetic field and measuring the quantities of interest in a particular experiment. That is, the interrogator/reader includes both the signal generation electronics and radiation means (i.e. an antenna or antennae) functionally connected to thereto. For example, an RFID reader or the like device, in the sense that it is capable of transmitting at least one command signal according to an established RFID protocol and determining whether the command was executed by the tag or not, can be used for measuring the activation point of an RFID tag. The same principle applies to other wireless communication system architectures and protocols as well.

By "measurement of the response of a tag" we mainly mean measuring the threshold power of the activation of the tag and/or determining the strength of the backscatter signal (especially passive RFID tags). The threshold power is primarily the smallest power of the reader with which the tag reacts to the command according to the protocol used. The tag can react to the command by replying, such as in case of a "Query" command according to the EPC Class 1 Gen 2 protocol. However, according to the protocol the tag does not reply at all to a "Select" command, but the tag only changes its internal operation state. On the other hand, the tag can also reply to "Write" command by stating that there is not sufficiently power available for executing the command. The "strength of the backscatter signal", on the other hand, is the signal strength returning to the reader if/when it replies to a command.

A person skilled in the art will understand that the threshold power can also be measured differently.

By an "anechoic chamber" we mean a chamber having walls that do not essentially reflect the signal at the frequency or frequency band used. Thus there is no significant multi-path propagation.

By a "reader-tag geometry" (or similarly "interrogator-transponder") we mean the mutual spatial positional relation of the antenna of the reader, the tag to be measured and the surrounding environment interacting with the RF waves. In an anechoic chamber the essential reader-tag geometry is reduced into a mutual locational relation of the antenna of the reader and the tag to be measured, because the contribution caused by the environment is non-existent (in an ideal case). It is to be noted that the orientation of the reader antenna does have an effect (unless the antenna is fully homogenically omnidirectional antenna), as does the orientation of the tag on both the strength of the measured response and the reflections. Thus, a change in the orientation of both the tag and the reader along any possible rotational direction generally has an effect on the reader-tag geometry.

"Characterization of a radio link" in the target environment generally means any action, such as calculating a parameter, function, graph or model, made based on the measurement of the reference transponder and wherein the multi-path propagation of radio waves in the target environment is the determining factors or one of the determining factors. Thus, characterization of the radio link characterizes mainly the target environment.

"Calibration to transponder/tag (location)" means using the results of the radio link characterization in a way that allows taking into account the multi-path propagation of radio waves in the target environment in further measurements and analyses. Typically, an interrogator-transponder geometry-dependent calibration function is calculated. "Compensating multi-path propagation/radio reflections" means utilizing the results of the radio link characterization in a further measurement in a way that the effect of the target environment of the measurement is suppressed to a significant degree.

There are various embodiments, where measurements are carried out in two or more reader-tag geometries in order to be able to determine the quantity of interest. That is, a measurement may comprise measurements in several different mutual locations of the antenna and the tag whose response is to be measured. The location can be varied with respect to one (e.g. distance), two (e.g. horizontal grid of measurement locations of the tag) or all three coordinate axes, depending on the objective of the measurement. Assuming that the properties of the tag to be measured is a constant factor, it is irrelevant, whether the measurements are carried out successively using a single tag moved from one place to another or using a preconfigured matrix of tags, which are measured successively or at the same time. The latter embodiment provides a convenient way of characterizing the measurement environment rapidly and in a well repeatable manner.

INDUSTRIAL APPLICABILITY

The invention is industrially applicable. It is especially advantageous in RFID system design. The designer uses a known reference tag. In the target environment, the designer measures the response of the tag in the chosen tag-reader geometry (which can be a geometry characteristic for the target environment or for a logistic operation performed therein or some other). The designer can then calculate the reflection function with a computer on the basis of the measurements. He can further measure one or more tags in the same geometry and calculate with the reflection function of the environment the real tuning frequency/frequencies of the tag(s) as well as estimate the suitability of the frequency for the chamber/environment on the basis of the reflection function.

It is to be noted that in the measurements the reader or even the antenna of the reader does not have to be the same as that used in the anechoic chamber, because (in an ideal) anechoic chamber the directivity of the antenna is not significant anyway.

The method can also be used in systems with two or more reader antennae (separate transmission and reception antennae) or even in situations in which the response of the tag is measured with conductors using a wired system. In this case the tag-reader geometry includes the relative positions of the tag and all antennae.

As examples of target environments we can mention ports, airports, logistics halls and product lines, among others. The experimental results described later in this document reveal the potential and industrial applicability of the proposed method in more detail. In summary, the experiments provide support for three main practical aspects of the invention and their advantages: Firstly, calibrating the measurements to the tag location allows reliable performance measurements to be performed using components that have not been thoroughly characterized. Secondly, compensating multi-path propagation allows reliable performance measurements to be performed without an expensive anechoic chamber. Thirdly, characterizing the environment for reflections is a tool for designing RFID systems that take the environmental properties into account.

BRIEF DESCRIPTION OF DRAWINGS

In the following, the different embodiments of the invention are disclosed in more detail with reference to the appended drawing.

DETAILED DESCRIPTION OF EMBODIMENTS

The present method provides a practically valuable way of characterizing the radio link between an RFID reader and a tag, based on common tag performance measurements. The proposed characterization method has several application areas such as calibrating tag performance measurements to the location of the tag, compensating multi-path propagation in measurements, and characterizing a space for reflections. In the following, the problems behind the invention and some advantageous embodiments are described more closely.

Figure 1:
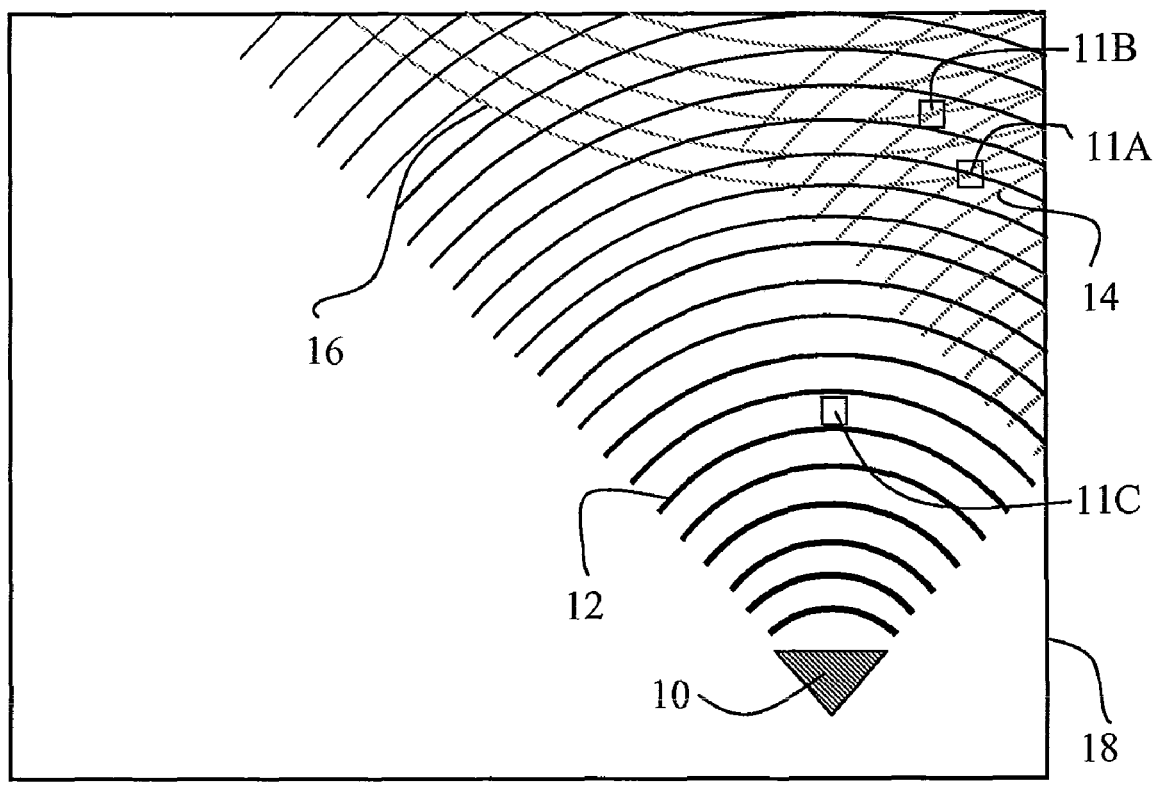
FIG. 1 is a conceptual illustration of multi-path propagation in a radio frequency system.

FIG. 1 illustrates a conceptual example of multi-path propagation causing the problems that the invention can solve. A radio frequency transmitter 10 transmits a primary wave 12 in room 18. The wall of the room 18 interacts with the wave 12 and a secondary reflected wave 14 is generated in the room. The primary wave is also reflected from the back wall of the room 18 and a second secondary wave 16 is formed. If the tag is located at place 11A, the direct field and the reflected fields amplify each other. The fields reflected in point B together attenuate the directly propagating field, causing an increase of the minimum transmission power needed for the activation of the tag. The field propagating directly at C is so much stronger than the reflected fields that the reflections are not very significant. The example of the conceptual illustration is naturally a simplification of a real situation, as the waves are attenuated as they propagate and they are reflected an incalculable number of times between the walls, forming standing waves with local minimums and maximums in the room.

Figure 2A:
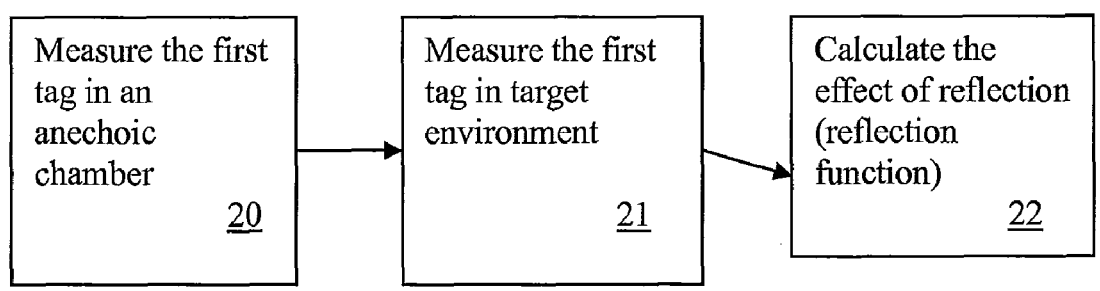
FIG. 2a is a flow diagram of the basic principle of the method according to the invention.

With reference to FIG. 2a, when the response of the reference tag in the anechoic chamber is known (step 20), the method can be performed by means of the following steps:
  measuring the reference tag in a measurement environment (step 21), and
  the measurement results achieved for the reference tag in the measurement environment and the anechoic chamber are subtracted from each other (step 22).

The result is a transfer function describing the reflections in the chamber and characteristic of the exact location of the transmitter and the receiver (in short "reflection function"), characterizing the radio link accomplished in the measurement environment and thus the measurement environment itself. The reflection function is dependent on the measurement geometry used in the measurement environment.

Figure 2B:
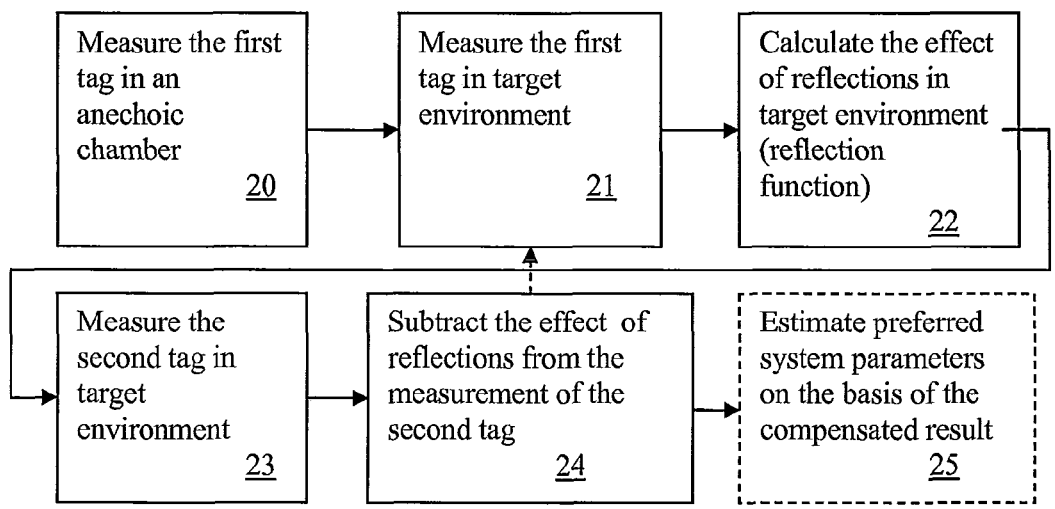
FIG. 2b is a flow diagram according to a preferred embodiment of the present method.

With further reference to FIG. 2b, when it is desired to analyse the operation of a new (different type) of tag in the measurement environment, the anechoic chamber is no longer needed. Thus, the following steps are additionally performed:
  the new tag is measured in the measurement environment (step 23), and
  the reflection function resulting from the reference tag is added to the measurement result, whereby a compensated end result is achieved (step 24).

The method makes it possible to estimate system parameters (step 25) in a novel way. The system parameters are, among others, a preferred reader-tag geometry in the target environment (including the geometry of the actual target environment and the location of its movables), the directional sensitivity of the tag, the tuning frequencies of the tag, the directivity of the antenna of the reader and the adjustment parameters of the reader (transmission power, the used frequency channel, data transfer speed, modulation type).

According to one embodiment the activation threshold of the tag is measured, i.e. the smallest possible transmission needed for activating the tag in the used reader-tag geometry is determined. By activation is meant that the tag reacts to the command according to the used protocol.

The measurement of the activation threshold can be carried out, for example, by transmitting with the reader, at a specific frequency of a carrier wave, to the tag a command using power to which the tag does not yet reply. The power is then incrementally increased giving a command at each power, until the tag replies correctly according to the used protocol. This threshold power is the actual object of the measurement.

The method can be carried out iteratively, i.e. repeating steps 21-24 while changing at least, and most preferably only one system parameter (arrow with dashed line in FIG. 2b). Thereby it is possible in step 25 to estimate the effect of especially this system parameter to the executability of the measurement on the view point of multi-path propagation. In case a system parameter having an effect in the measurement made in the anechoic chamber as well is being changed, step 20 can also be repeated or previously determined measurement results can be utilized. Step 20 can be executed in a similar adjacent environment especially if the adjacent environment of the tag changes the measurable properties thereof (such as a change of tuning frequency possibly caused by the material underlying the tag). In the following, two exemplary embodiments using iterative determination are described.

Most preferably the step 20 (or a corresponding simulation, as stated earlier) is performed as a function of both frequency and power (essentially non-zero, such as with frequency and power ranges according to standards), whereby in later steps there will be sufficiently data for calculating the real reflection function and for characterizing the radio link.

According to one embodiment the method is used for determining an optimal (fulfilling the desired criteria) reader-tag geometry in a target environment. Such a measurement can comprise steps in which
  a reference tag is placed in the desired read area within the target environment and the radio link is characterized according to the present method,
  the direction and/or location of the antenna of the reader is changed and the characterization is repeated with different geometries, and
  of the tested geometries, the one with the best operating link is chosen (i.e. the reflections from the environment affect the link the least, improve the link the most or are least sensitive to frequency changes, depending on the desired effect).

The method can also be used for determining the optimal (fulfilling the desired criteria) operational frequency in the target environment. In such a measurement
  a reference tag is placed in the desired read area within the target environment and the radio link is characterized according to the present method,
  the frequency of the carrier wave of the reader is changed and the characterization is repeated at different frequencies (such as at allowed channels), and
  of the tested frequencies, the one with the best operating link is chosen (i.e. the reflections from the environment affect the link the least or improve the link the most, depending on the desired effect).

An application in which the antenna is changed between the repeated measurements, is also mentioned as a preferred embodiment. Thus it is possible to select an antenna with which the reflections of the target environment are the most preferred for the tag-reader geometry used.

According to one embodiment, the present radio link characterization method utilizing the reference transponder is further applied for characterizing a component, such as an antenna, attenuator, circulator, directional coupler, of the measurement system. Most preferably, the antenna is characterized, as its proper characterization for practical measurement purposes is not easy or possible using, for example, a network analyzer due to its radiating field.

A conventional way of measuring properties of an antenna is to excite it by inputting known power thereto and measuring the power density of the radiation field at said power level at specified locations. In the present method, the basic idea is to vary the input power of the antenna in order to find out the minimum power required to activate a transponder. By this means, it is possible to measure at least the radiation pattern of the antenna, gain of the antenna as a function of frequency and the location of the phase center of the antenna, i.e., the apparent source of radiation when the antenna is used for transmitting. In some antenna types, e.g. log-periodic, the apparent phase center will strongly depend on frequency. This is a crucial issue if an antenna having dimensions comparable to the measurement distance is used.

As an example, the method for determining the location of the apparent phase center of an antenna as a function of frequency is described in more detail. In such a measurement
- a transponder is placed in the radiating far field at a first distance from the antenna to be characterized, the antenna is connected to an interrogator and is used as the transmit or receive antenna of the radio link,
- the response of the transponder is measured according to the present method,
- the transponder is moved to a second distance while still remaining essentially in the radiating far field,
- the measurement of the response of the transponder is repeated,
- the relative change of the distance between the phase center and the transponder is calculated from the relative change of the measured transponder responses,
- the location of the phase center is calculated from the relative change of the distance between the phase center and the transponder, and the distance between the two measurement points.

The steps of the method can be executed with spot frequencies or with a chosen frequency band. Measuring the threshold power of the tag as a function of frequency is an especially preferred embodiment. In this case the multi-path distortion of the frequency response of the tag will become spectrally visible. This allows the strong standing waves caused by multi-path propagation to be considered in system design and the operation frequency can be, for example, chosen to be sufficiently far away from this frequency band.

Theory Behind the Invention

According to a preferred embodiment, the proposed method is based on measuring both the power required to activate a known tag and the power scattering back from the tag, typically in an unknown environment. The measurement reveals the path loss for the forward link and the return link. The method has several application areas, such as calibrating tag performance measurements up to the location of the tag, compensating multi-path propagation in tag performance measurements, and characterizing a given space for reflections, for example for finding out the tuning frequency of a tag. Successful operation of the above-described method in these areas has been proven by measurements. Example cases describing each of the abovementioned applications are presented below. However, the technical background for motivating the examples is discussed in detail first.

Assessing the performance of a tag can be carried out by measuring from how far the tag can be read with a commercial reader. This method may be sufficiently accurate for applications in which the effect of multi-path propagation is not significant. However, in order to make measurements comparable between different measurement systems located at different sites, the procedures and equipment need to be standardized more.

At the moment, different measurement standards (EPCglobal/ISO) and common practices disagree on many issues, such as the units in which to communicate the performance parameters, and the measurement equipment used. However, there seems to be a consensus on the most important issues. First of all, tags are measured in the active state, i.e. by sending them a command, and by detecting and evaluating the response. Thus, the tags are in the same operating point as they are when interrogated in a normal application. Secondly, even though the units are different, the measured concepts such as sensitivity and backscatter signal strength are the same, and the units can often be interchanged quite easily.

Figure 4:
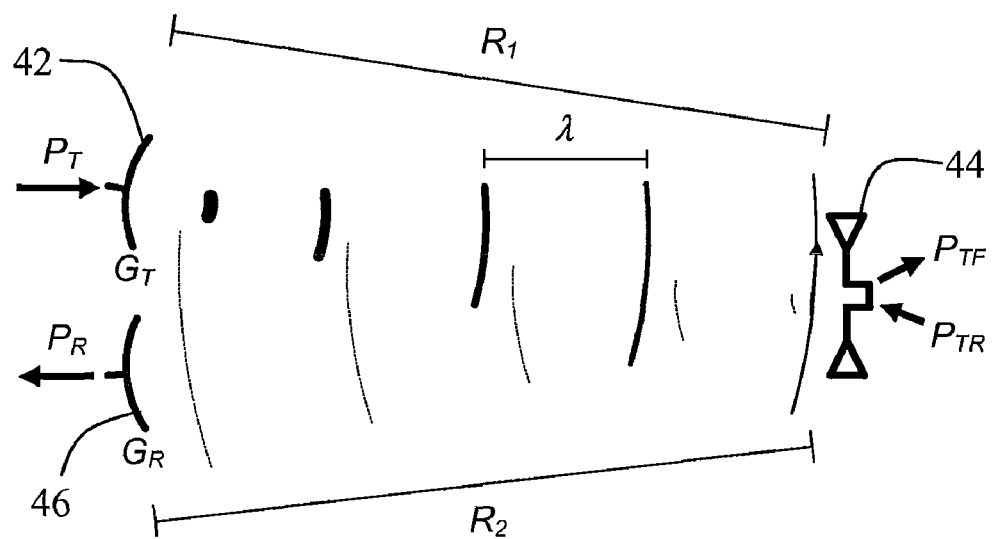
FIG. 4 shows schematically the measurement setup used in tag performance experiments.

The assessed tag performance metrics are hereinafter divided into two categories, those describing the forward link, and those describing the return link. To clarify this division, FIG. 4 shows the typical measurement setup and the related parameters. The forward link consists of a transmitter connected to a transmit antenna 42 sending electromagnetic waves to power up the tag 44 and to send commands to it. The return link, in turn, consists of a receiver connected to a receive antenna 46 used to record the response from the tag. In more detail, the transmitter is used to generate RF power $P_T$ radiated by a transmit antenna with the gain $G_T$. The tag antenna, the distance $R_1$ away from the transmit antenna, collects the power $P_{TF}$ (power on tag forward) from the incident field. The tag modulates the electromagnetic field thus transmitting a return power $P_{TR}$ (power on tag reverse) over the distance $R_2$ to the receiver antenna with the gain $G_R$. As a result, the signal power $P_R$ can be recorded at the receiver. $\lambda$ is the carrier wavelength.

A. Forward Link

For current RFID tag designs, in the majority of cases, tag performance is forward link limited, i.e. the limiting factor for read range is power delivery to the IC. Since the maximum power radiated by a reader is restricted with regulations, power delivery over a given distance is determined primarily by the tag design. First of all, the IC requires a certain amount of power to operate. In addition, the antenna design and matching circuit determine how effectively the radiated power is delivered to the IC. Finally, also the materials surrounding the tag and other environmental factors affect the properties of the tag. For the purposes of the present model, we consider the tag as one unit, and concentrate on the amount of radiated power needed to activate the tag, which is commonly called tag sensitivity.

The basic methodology of how to measure tag sensitivity is generally known to a person skilled in the art. Typically a signal source attached to an antenna is used to send a command to the tag, and to vary the transmit power to find the minimum power for the tag to be able to respond. The response is detected and decoded with a receiver attached to another antenna. This test can be repeated with different carrier frequencies to get a comprehensive picture of the tag sensitivity.

In order to concentrate on the properties of the tag rather than the measurement setup, sensitivity should be presented as a geometry-independent unit that describes the required power at the location of the tag. Different measurement standards use different units that are quite easily interchangeable. Assuming an anechoic environment, the power density at the tag location is $$S = \frac{P_T G_T}{4\pi R_1^2}, \quad (1)$$

where $P_T$ is the transmit power, $G_T$ is the gain of the transmit antenna, and $R_1$ is the distance between the transmit antenna and tag. After calculating the power density required to activate the tag $S_{min}$, the three most widely used metrics for tag sensitivity: theoretical maximum read range $R_{1,max}$, minimum electric field strength $E_{min}$, and minimum power on tag $P_{TF,min}$, can be calculated:

$$R_{1,max} = \sqrt{\frac{P_{EIRP,max}}{S_{min} 4\pi}}, \quad (2)$$

$$E_{min} = \sqrt{S_{min} Z}, \quad (3)$$

$$P_{TF,min} = S_{min} \frac{\lambda^2}{4\pi}, \quad (4)$$

where $P_{EIRP,max}$ is the maximum effective isotropic radiator power (EIRP) limited by regulations—often the European limit 35 dBm is used, Z is the impedance of free space 377Ω, and λ is the wavelength.

Below, the minimum power on tag concept is used, because it being a power reading simplifies path loss calculations. Thus, the forward link between the reader transmitter and the tag can be characterized with a forward path loss concept $$L_{PF} = \frac{P_{TF}}{P_T}. \quad (5)$$

B. Return Link

As tag designs evolve, more and more cases occur, where the operating range or reliability is not limited by power transfer to the tag, but by signal transfer to the receiver of the reader. This is already the typical case with battery-assisted tags. The minimum signal strength that the reader can reliably detect and decode is usually represented as the reader sensitivity $P_{R,min}$. The signal returning from the tag should thus exceed this level.

Tags create the modulated backscatter signal by changing the chip impedance between two states. This changes the matching between the chip and antenna and further the signal reflecting from the tag. The matching and the reflected signal depend on the carrier frequency and power, as well as the materials surrounding the tag. Again, for the purposes of this model, we consider the tag as one unit, and concentrate on how effectively the tag transforms the occurring radiated power into a backscattered signal.

A typical method for measuring backscatter signal strength is to use a signal source attached to an antenna to send a command to the tag, and to measure the strength of the response with a vector signal analyzer. This test can be repeated with different carrier frequencies and power levels to characterize the tag comprehensively.

A commonly used concept describing the backscatter signal strength is differential radar cross section (ΔRCS or Δσ), a calculated entity that lends itself from radar applications. Differential radar cross section describes the strength of the signal reflected from the tag due to backscatter modulation, and is determined as $$\Delta\sigma = \frac{P_{TR}}{S}, \quad (6)$$

where $P_{TR}$ is the backscattered power, and S is power density, both at the tag location. Since the tag may modulate the amplitude and/or phase of the reflected signal, differential radar cross section is a complex quantity, thus consisting of amplitude and phase. A reader is typically built with a heterodyne detector and can thus as well detect amplitude or phase modulated responses. Once again, different standards and industrial bodies have different interpretations of the backscattered power used in the equation. The power may be either total backscattered power, sideband power, or even the difference in the reflected power between the two states.

For the purposes of some of the measurements described below, the backscattered power at the tag location $P_{TR}$ is a measure of interest. Since the differential radar cross section of the tag may vary as a function of the power on the tag, the operating point used in the measurements is fixed. The sensitivity threshold $P_{TF,min}$ is a comprehensible choice. That is, the minimum power required to activate the tag is determined, and the returning signal strength at that transmit power is measured. Once again, the return link between the tag and the reader receiver can be characterized with a forward path loss concept $$L_{PR} = \frac{P_R}{P_{TR}}. \quad (7)$$

In other words, the present characterization method utilizes the property of common passive UHF RFID tags, that they typically have a known, abrupt power-up threshold and a known backscatter signal strength at that threshold. By knowing these two properties of any given tag, the tag can be used as an indicator of whether a certain power level has been exceeded and as a constant power signal source.

The proposed method is based on the assumption, that we have at least one tag, the performance of which is known, referred to as a reference tag. That is, we have measured, simulated, or acquired in any other way, the two power levels $P_{TF}$ and $P_{TR}$ of the tag with the frequencies of interest. The method itself goes as follows:

1. Measure the transmit power $P_T$ required to activate the reference tag, and the power returning from the tag $P_R$ in the target environment,
2. Calculate the forward and return path loss $L_{PF}$, $L_{PR}$ with (5) and (7).

The path loss values describe the radio link between the transmitter of the measurement system and the tag, as well as between the tag and the receiver of the measurement system. The values are characteristic of the given geometry including the effect of multi-path propagation. If the procedure described above is repeated with different frequencies and locations, the environment can be characterized comprehensively.

The method can also be used to separate the response of the tag from the effects of the environment, when performing tag performance measurements in an environment that is not anechoic. This can be done by using the following additional steps:

3. Measure the transmit power $P_T$ required to activate another tag, and the power returning from the tag $P_R$ in the target environment
4. Calculate the forward and return power on tag $P_{TF}$, $P_{TR}$ with (5) and (7).

The link characterization method described above is based on several assumptions, the accuracy of which affects how well the method functions. Firstly, the characterization applies only to the exact location where the characterization is done. Secondly, the measurement method assumes that the radiation pattern of the measured tag is effectively similar to the radiation pattern of the reference tag. In other words, the measured tag and the reference tag should collect radiation from all propagation paths similarly. Finally, even though the proposed characterization method functions well by using commercial tags as reference tags, it should be noted that they are not calibrated measurement equipment, and their properties may vary with different environmental properties, such as temperature.

EXPERIMENTS

The proposed link characterization method was applied to three different cases to illustrate its possibilities. The first case demonstrates calibrating tag performance measurements to the tag location. This calibration technique allows reliable tag performance measurements to be performed, even though all components of the measurement system are not known. The second case demonstrates compensating multi-path propagation in tag performance measurements. This technique allows reliable measurements to be performed in an environment that is not anechoic. The third case demonstrates characterizing an environment for reflections. The reflection characterization can be used for optimizing a reader configuration.

The presented measurements were are performed with Voyantic Tagformance Lite, a performance measurement system for UHF tags. The measurement system comprises a measurement unit and software running on a laptop or a PC. The measurement unit includes a transmitter for generating the carrier and for modulating it in order to send commands to the tag. The unit also includes a heterodyne receiver that uses the carrier as its local oscillator frequency. Both the transmit power and receive power measurements are calibrated and traceable to standard laboratories. In the presented cases, the measurements were performed by transmitting the Gen2 command Query to the tag and by detecting and measuring the strength of the RN16 response.

The reference tag was a typical Gen2 tag with a short dipole antenna. It should be noted, that any other tag with a known sensitivity-frequency and backscatter-frequency relationship could be used as well. However, it is important to ensure that the tag is sufficiently wide-band for the method to function throughout the desired frequency range.

Example Application 1

Calibration of Tag Performance Measurements to Tag Location

The vast majority of RF measurement systems are calibrated to the RF-out and RF-in ports with good accuracy. However, when external components, such as an amplifier, a circulator, cables, antennas, etc., are connected to the system, the absolute power accuracy is lost unless all the added components are each characterized in detail and accounted for. The proposed link characterization method provides the possibility to use uncharacterized components in the measurement system without affecting the measurement result itself.

Figure 5:
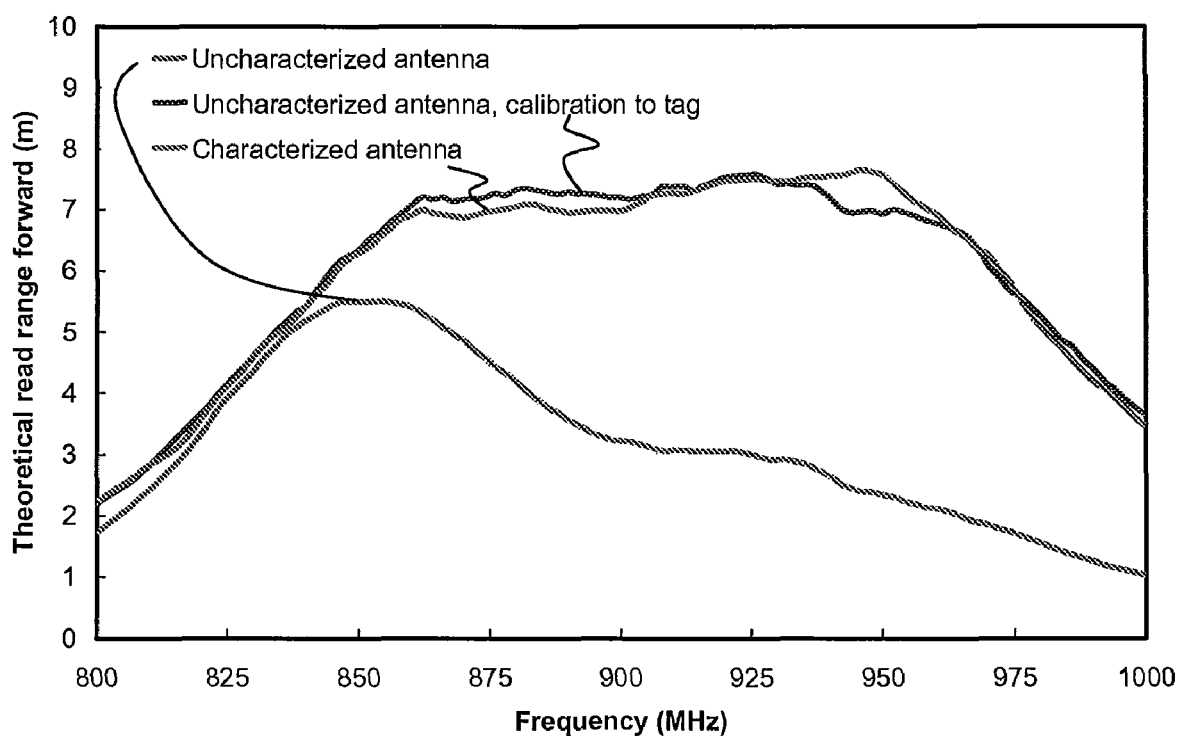
FIG. 5. shows sensitivity measurement results for a single tag.

To provide an example, a commercial tag was chosen, the tag having an exceptionally uniform sensitivity from 860 MHz to 960 MHz according to its datasheet graph provided by the manufacturer. The tag was measured for the theoretical read range in a practically anechoic free-air environment. The measurement was performed with the Tagformance Lite measurement system attached to an uncharacterized circularly polarized reader antenna for which the antenna gain (9.0 dBic) was only specified at the ETSI center frequency. Assuming the reader antenna gain constant across the measurement range from 800 MHz to 1000 MHz, and converting the measurement result to theoretical read range (2 W ERP), undoubtedly results in misleading read-range values as shown in FIG. 5, which shows the sensitivity measurement results for the commercial tag using the uncharacterized antenna. Using the presented link characterization method, the path loss values were measured for each measurement frequency using the reference tag. Subsequently, the unknown gain characteristics of the reader antenna were omitted completely and the correct measurement results were calculated based on the path loss values. To confirm the measurement results obtained with calibration to the tag, the measurement was conducted with a well characterized antenna. Both results are presented in FIG. 5. The results match well with each other and with the ones provided by the tag manufacturer.

Example Application 2a

Compensating Multi-Path Propagation in Performance Measurements

Tag performance measurements are typically performed in an anechoic chamber in order to get comparable results without the effects of multi-path propagation. Anechoic chambers for the UHF range are large rooms that are typically covered with RF absorbers and shielded against external disturbances. Building an anechoic chamber is a large investment, and even after having one, it might often be feasible to perform some measurements in a normal laboratory environment. The proposed link characterization method provides the possibility to compensate the effects of multi-path propagation from measurement results acquired in an environment that is not anechoic.

To provide an example, the sensitivity of a dipole-type inlay tag was measured as a function of frequency in a space other than an anechoic chamber. This kind of a measurement could be performed by the R&D organization of a tag manufacturer to quickly verify a new tag design, or by a system integrator to evaluate the applicability of a given tag to a specific application. It should be noted, though, that local radio frequency regulations may limit radiated measurements. Thus, it is the responsibility of the measuring party to ensure, that radio frequency interference limits are met at the borders of their premises.

Figure 6:
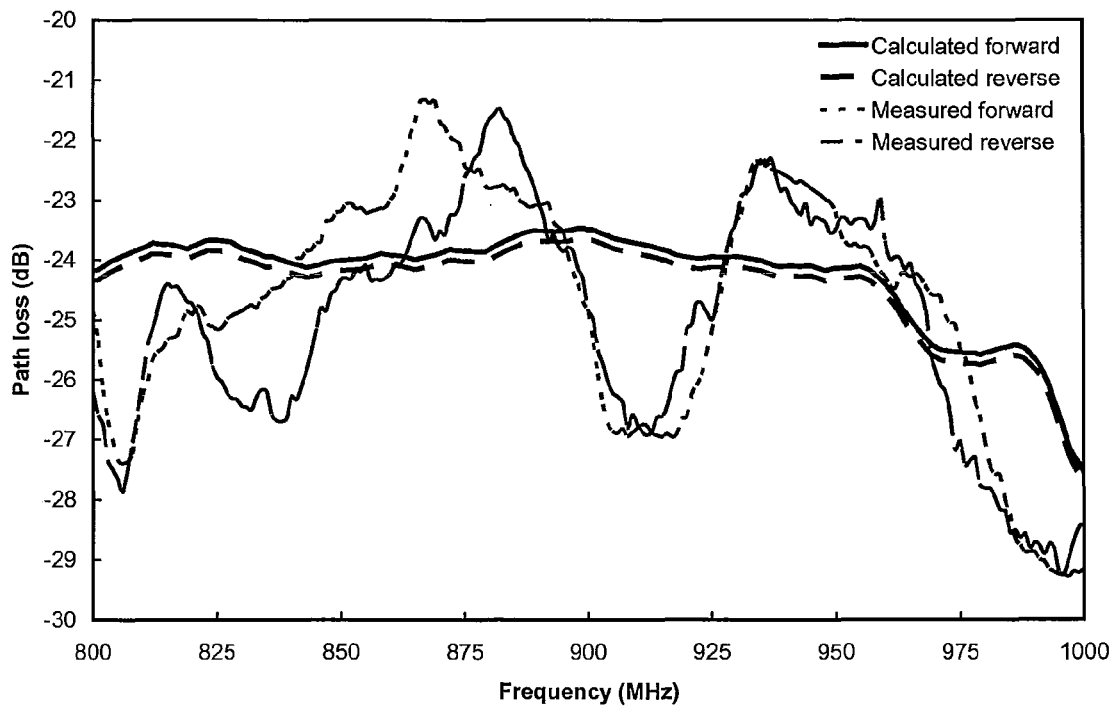
FIG. 6 depicts measured and calculated path loss curves. The calculated path loss curves assume an anechoic environment.
Figure 7:
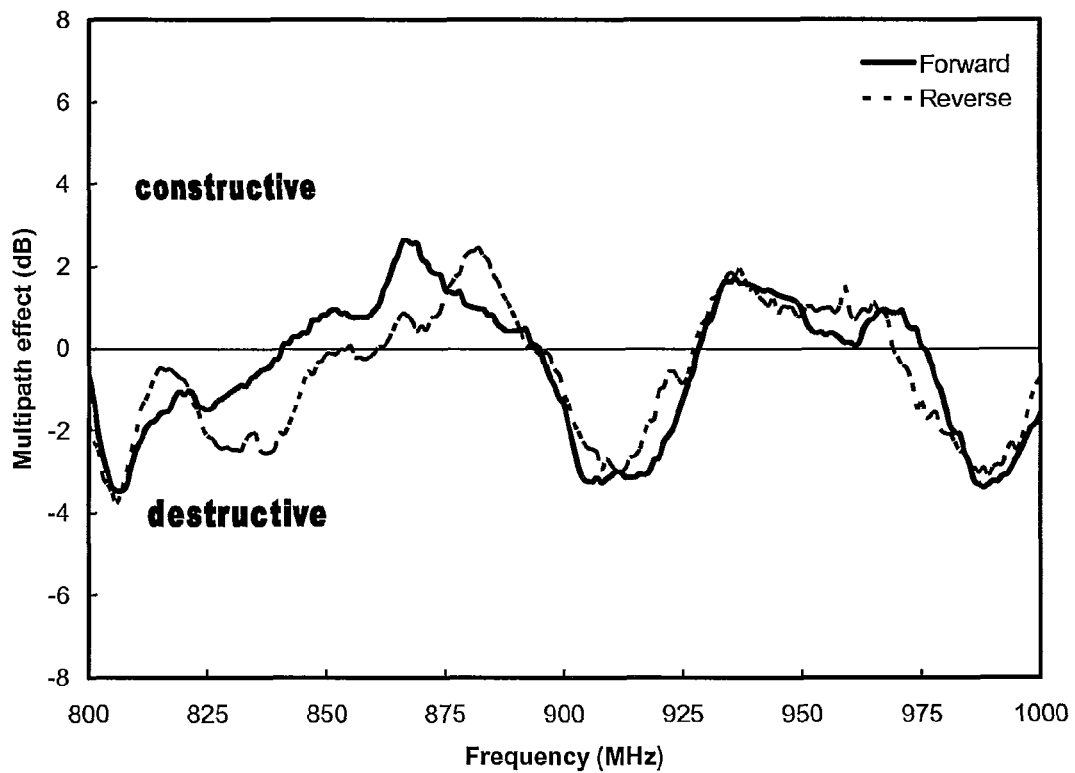
FIG. 7 shows as a graph multi-path effect as a function of frequency.

Once again, the measurement procedure was started by measuring the forward and return path loss curves as a function of frequency in the range 800 to 1000 MHz (steps 1 and 2). The measured path loss curves are shown in FIG. 6. Along with them, calculated path loss curves assuming an anechoic environment are also shown. It should be noted that these path loss curves include the effect of the measurement antennas, cables, and the free-space path loss. The measured path loss curves seem to vary around the calculated ones. That is because multi-path propagation causes variations, i.e., constructive or destructive interference at the tag location depending on the frequency. The difference of the measured and calculated path loss curves is presented in FIG. 7. At some frequencies, the multi-path propagation creates a constructive interference at the tag location. On other frequencies, the interference is destructive.

Figure 8:
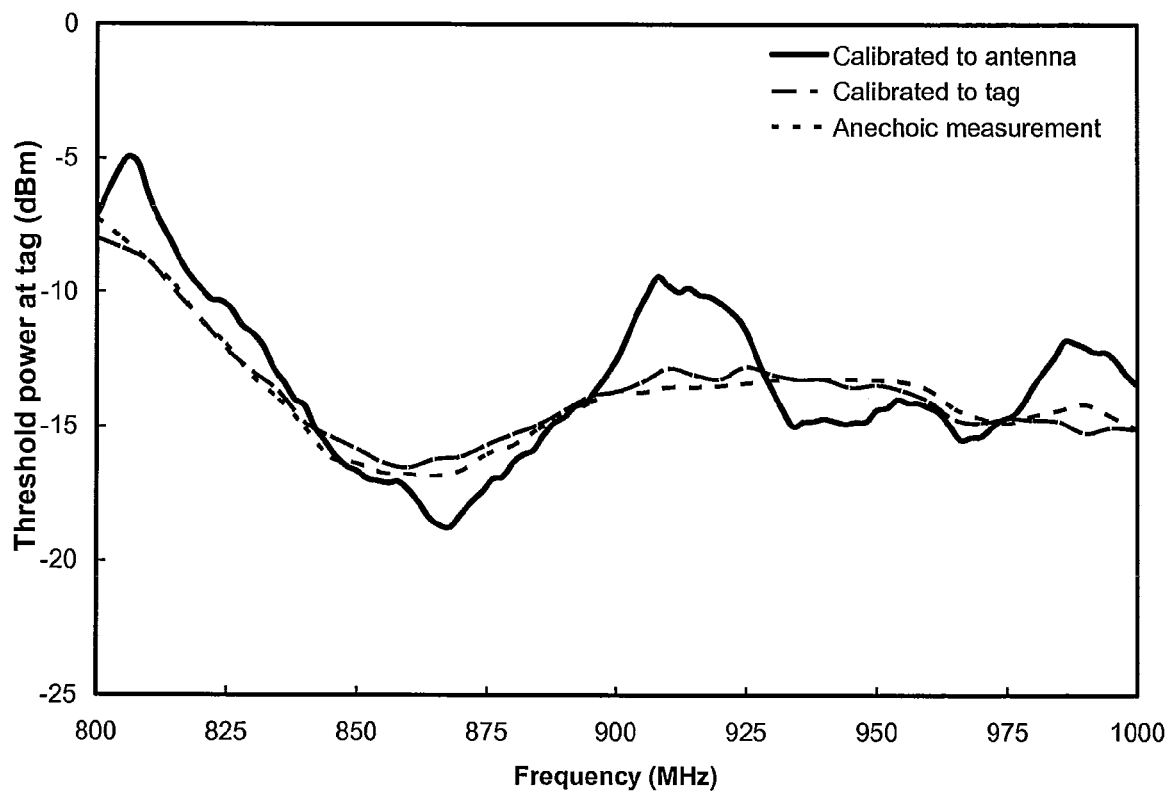
FIG. 8 illustrates the threshold power as a function of frequency measured in the target environment with normal calibration to the antenna, and calibration to the tag. A reference measurement from an anechoic chamber is presented as a reference.

After characterizing the path loss, the sensitivity measurement can be performed (steps 3 and 4). The results are shown in the Calibrated to tag plot in FIG. 8. In order to demonstrate the significance of the improvement, also the uncompensated measurement result (Calibrated to antenna) and measurement result from an anechoic chamber (Anechoic measurement) are presented. The up to 3 dB deviation between the uncompensated and anechoic curves are diminished to a less than 0.5 dB deviation between the compensated and anechoic curves due to the calibration procedure.

Example 2b

Reflection Environment and Impedance Tuning

Figure 3:
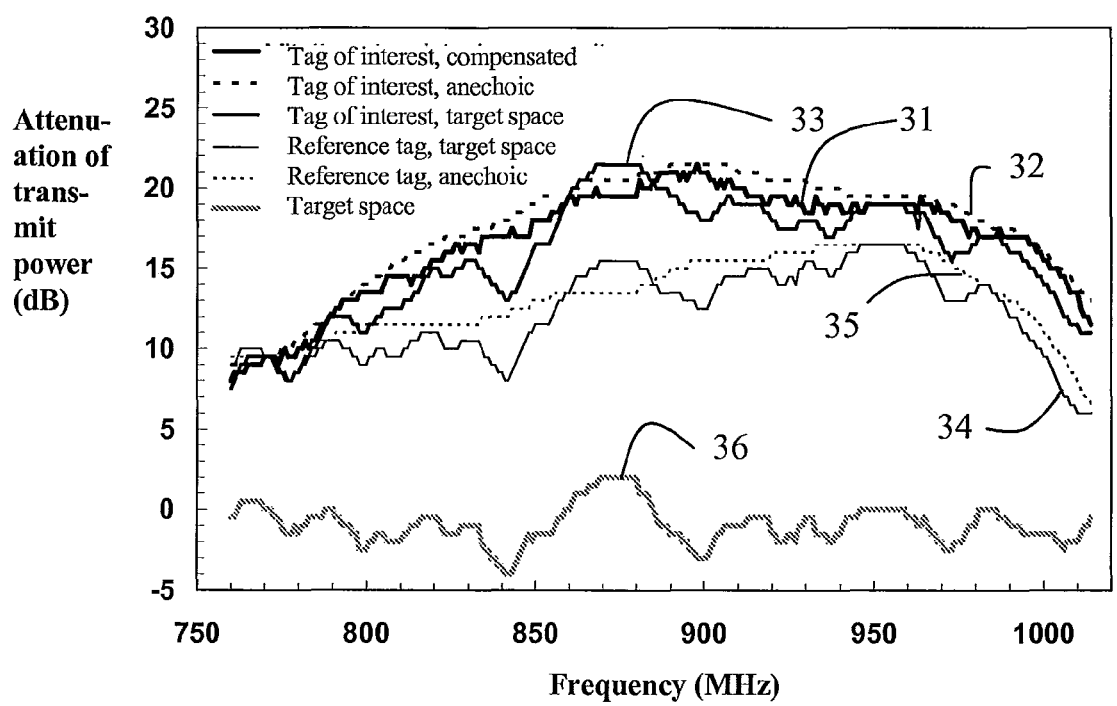
FIG. 3 is a graph of the measurement result produced by means of the present method.

FIG. 3 shows yet another measurement result. The figure shows the response of a reference tag measured in an anechoic chamber in frequency band 760-1010 MHz (curve 35) and in the target environment (curve 34), the reflection function of the environment calculated on the basis of these (curve 36), the response of the tag being studied in anechoic chamber (curve 32, not a necessary comparison measurement) and in the target environment (curve 33). The compensated response of the tag being studied calculated per the above is shown in curve 31. From the graph it can be seen that the result compensated by the method corresponds with the result from the anechoic chamber with good accuracy. On the basis of both graphs it can be seen that the impedance tuning peaks at around 900 MHz. Without correction the peak would seem to be around 870 MHz, but the reflection function of the environment shows this to only be an interference maximum caused by the environment. Thus, the correction to the result achieved by the method is considerable.

Example Application 3

Characterizing an Environment

Knowing the reflection environment may give important information for designing a functional RFID implementation. Reflections from the floor, ceiling, and walls, as well as different sources of clutter have a huge impact on the reading area of a port reader. Thus assessing reflections is an important part of a site survey.

Figure 9:
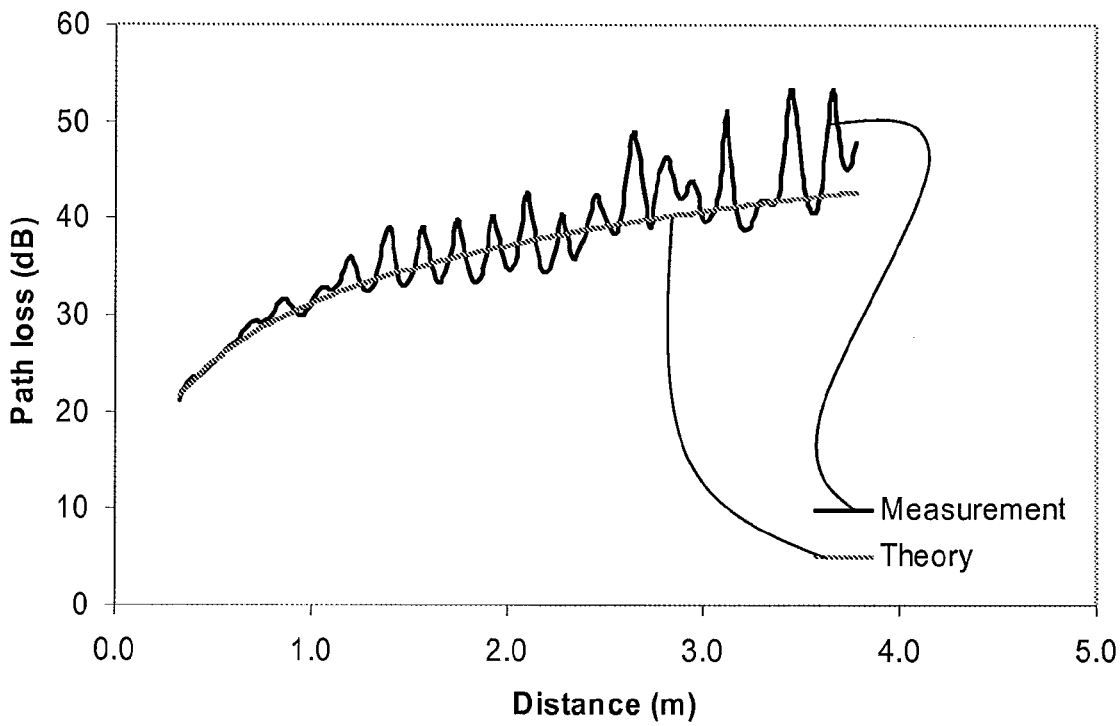
FIG. 9 depicts path loss measurement results (bumpy curve) together with the theoretical path loss (smooth curve) as a function of distance in the range 0.3 to 3.8 m.

Once again, Tagformance Lite was used as the signal source and measurement equipment, and the reference tag as a sensor. In this experiment, the present measurement method was utilized for characterizing the reflection environment in a room. Separate transmit and receive antennas were attached to a plastic stand. The reference tag is attached to another plastic stand that is moved in the room. The measurement system was used to determine the power required to activate the tag. Since the antennas, cables, and the reference tag were known, the path loss of the air interface could be determined. The measured path loss is displayed in FIG. 9 together with the theoretical path loss assuming an anechoic radio link calculated as $$L = 20\log\left(\frac{\lambda}{4\pi R_1}\right). \quad (8)$$

The results show that the measured path loss plot seems to oscillate around the theoretical plot. The oscillation increases as the distance between the transmit antenna and the tag increases. This is quite intuitive, since at close ranges, the direct link between the transmit antenna and tag is significantly shorter than between the tag and reflecting elements.

The significance of these measurements is in characterizing the reflection environment as one component of the RFID system. First of all, if the oscillation is large, the environment is challenging, since with a given transmit power the first locations where the tag can not be read are relatively close to the antenna. On the other hand, large oscillation may result in unwanted tags to be read from far away when the direct and reflected RF waves interfere constructively.

The above preferred embodiments, experiments and the attached drawings are for illustrative purposes. They are not intended to limit the scope of invention which is defined in the appended claims. In particular, measurements utilizing the present principles can be geometrically and mathematically implemented in a number of ways and using various kinds of interrogators and transponders within the scope of the basic idea of the invention.

The invention claimed is:

1. A method for characterizing a radio link, comprising utilizing a radio frequency interrogator and a first wireless radio frequency transponder, the response of which in an essentially anechoic space is known, comprising
   (a) measuring the response of the first wireless radio frequency transponder in a target environment using a chosen interrogator-transponder geometry,
   (b) calculating a deviation between the responses of the radio frequency wireless transponder in the target environment and in the essentially anechoic space for characterizing the radio link established in the target environment.

2. A method according to claim 1, wherein the radio frequency transponder is an RFID tag.

3. A method according to claim 1, wherein the interrogator is an RFID reader.

4. A method according to claim 1, wherein the deviation between the responses of the radio frequency wireless transponder in the target environment and in the essentially anechoic space is used for compensating the effect of radio reflections from at least one other measurement carried out in said target environment.

5. A method according to claim 1, comprising
   (c) measuring the response of a second wireless radio frequency transponder in the target environment using the chosen interrogator-transponder geometry,
   (d) using said response deviation for eliminating the effect caused by the target environment from the measured response of the second wireless radio frequency transponder.

6. A method according to claim 5, wherein the steps (a)-(d) are performed repeatedly, changing at least one, and preferably only one, system parameter between the repeated measurements.

7. A method according to claim 6, wherein the system parameter comprises one of the following: interrogator-transponder geometry within the target environment, directional sensitivity of the transponder, tuning frequency of the transponder, directivity of the antenna of the interrogator, adjustment parameters, such as transmission power, used frequency channel, data transfer speed and modulation type of the interrogator.

8. A method according to claim 1, wherein the measurements are performed at a frequency band having an essentially non-zero bandwidth.

9. A method according to claim 1, wherein the measurement of the response of the wireless transponder(s) comprises determining the smallest transmission power with which the wireless transponder(s) react(s) to a sent command according to a protocol used.

10. A method according to claim 1, wherein the measurement of the response of the wireless transponder(s) comprises determining the strength of the backscatter signal of the wireless transponders(s).

11. A method according to claim 9 or 10, wherein forward and/or return path losses are calculated using said smallest transmission power and said strength of the backscatter signal at said smallest transmission power.

12. A method according to claim 1, wherein (a) path loss(es) of the transmit and/or the return paths is/are measured as a function of mutual location of the wireless transponder and antenna(s) of the interrogator.

13. A method according to claim 12, wherein alteration of the path loss as a function of the distance is used for analyzing the characteristics of the target environment.

14. A method according to claim 1, wherein an interrogator-transponder geometry fulfilling predefined criteria in the target environment is determined on the basis of the measurement.

15. A method according to claim 14, wherein
the first wireless transponder is arranged in the desired read area within the target environment and the measurement of the response of the first wireless transponder is performed with the interrogator,
the interrogator-transponder geometry, such as the directioning and/or location of the transponder or the antenna of the interrogator is changed once or more, and a measurement of the response of the first transponder is performed in said changed geometry,
the response deviations in said measurement geometries are calculated, and
a measurement geometry providing radio link performance of desired quality in the target environment is determined by means of the response deviations.

16. A method according to claim 1, wherein an operational frequency fulfilling predefined criteria in the target environment is determined on the basis of the measurement.

17. A method according to claim 16, wherein
the first transponder is arranged in the desired read area within the target environment and the measurement of the response of the first transponder is performed with the interrogator,
the frequency of the carrier of the interrogator is changed once or more and the measurement of the response of the first transponder is repeated with said changed frequency,
the response deviations at said frequencies are calculated, and
the frequency with a radio link performance of desired quality in the target environment is chosen on the basis of the response deviations.

18. A method for characterizing a radio link, comprising utilizing a radio frequency interrogator and a first wireless radio frequency transponder, the response of which in an essentially anechoic space is known, comprising:
(a) measuring the response of the first wireless radio frequency transponder in a target environment using a chosen interrogator-transponder geometry,
(b) calculating a deviation between the responses of the radio frequency wireless transponder in the target environment and in the essentially anechoic space for characterizing the radio link established in the target environment,
(c) measuring the response of the first wireless radio frequency transponder at a first distance and a second distance, different than the first distance, from the antenna in the far field of the antenna, and
(d) determining, based on said two measurements, the location of the apparent phase center of the antenna connected to the interrogator.

19. A method according to claim 1, wherein the shape of the radiation pattern of the antenna of the interrogator is determined by measuring the responses of the first wireless radio frequency transponder in the target environment using a plurality of different interrogator-transponder geometries either one at a time using a single transponder or simultaneously with multiple transponders.

20. A method according to claim 1, wherein the distance between the antenna of the interrogator and the transponder is not significantly smaller than the distance between the transponder and reflecting objects.

21. A method according to claim 1, wherein the measurements are performed at UHF range.

22. A method for calibrating a radio-frequency communications system in a target environment, comprising
placing a first wireless transponder to a first location within the target environment,
measuring the response of the first wireless transponder using an interrogator placed to a second location within the target environment,
comparing the measured response of the first wireless transponder with a response of the transponder in an essentially anechoic space for obtaining a calibration function characterizing said target environment.

23. The method according to claim 22, wherein the calibration function is used for determining system parameters of a communications system to be established to said target environment.

24. The method according to claim 22, wherein said communications system is an RFID system.

25. The method according to claim 1 or 22 used for designing a wireless communication network.

26. The method according to claim 1 or 22 used for designing an RFID system.

27. A method according to claim 18, wherein the method comprises determining the location of the apparent phase center of the antenna at a particular frequency, the location being calculated from the difference between the first distance and the second distance and the relative change of the response of the transponder.

28. A method for calibrating a radio-frequency communications system in a target environment, comprising:
placing a first wireless transponder to a first location within the target environment,
measuring the response of the first wireless transponder using an interrogator placed to a second location within the target environment,
comparing the measured response of the first wireless transponder with a response of the transponder in an essentially anechoic space for obtaining a calibration function characterizing said target environment,
wherein the response of the transponder is measured by:
determining the activation threshold power of the transponder, and
determining the strength of a backscatter signal obtained from the transponder at said activation threshold power.

* * * * *